(12) United States Patent
Sasaki et al.

(10) Patent No.: US 8,338,781 B2
(45) Date of Patent: Dec. 25, 2012

(54) CHARGED PARTICLE BEAM SCANNING METHOD AND CHARGED PARTICLE BEAM APPARATUS

(75) Inventors: Yuko Sasaki, Mito (JP); Makoto Ezumi, Mito (JP); Makoto Nishihara, Hitachinaka (JP); Tsutomu Kawai, Hitachinaka (JP); Toshiaki Yanokura, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/079,361

(22) Filed: Apr. 4, 2011

(65) Prior Publication Data

US 2011/0174975 A1    Jul. 21, 2011

Related U.S. Application Data

(63) Continuation of application No. 11/889,057, filed on Aug. 8, 2007, now Pat. No. 7,935,925.

(30) Foreign Application Priority Data

Sep. 27, 2006    (JP) .................. 2006-261651

(51) Int. Cl.
   *H01J 37/304* (2006.01)
(52) U.S. Cl. .................... 250/310; 250/396 R
(58) Field of Classification Search .................. 250/310, 250/306, 307, 396 R
See application file for complete search history.

(56) References Cited

U.S. PATENT DOCUMENTS

| | | | |
|---|---|---|---|
| 5,334,846 A | 8/1994 | Nakano et al. | |
| 6,407,398 B1 * | 6/2002 | Kurokawa et al. | 250/492.22 |
| 6,420,700 B2 | 7/2002 | Ooaeh et al. | |
| 6,509,564 B1 | 1/2003 | Suzuki et al. | |
| 6,580,075 B2 * | 6/2003 | Kametani et al. | 250/310 |
| 7,202,488 B2 | 4/2007 | Ota et al. | |
| 2006/0219907 A1 | 10/2006 | Takeshi et al. | |

FOREIGN PATENT DOCUMENTS

| | | |
|---|---|---|
| JP | 04-112443 A | 4/1992 |
| JP | 10-213556 A | 8/1998 |
| JP | 11-160054 A | 6/1999 |
| JP | 2000-040481 A | 2/2000 |
| JP | 2005-109235 A | 4/2005 |
| JP | 2006108123 A | 4/2006 |

OTHER PUBLICATIONS

Japanese Office Action, with partial English translation, issued in Japanese Patent Application No. 2006-261651, dated Sep. 9, 2011.
Entire Prosecution of U.S. Appl. No. 11/889,057 to Sasaki, et al., filed Aug. 8, 2007, entitled "Charged Particle Beam Scanning Method and Charged Particle Beam Apparatus".
Japanese Office Action issued in Japanese Patent Application No. 2006-261651 dated Apr. 3, 2012.

* cited by examiner

*Primary Examiner* — Kiet T Nguyen
(74) *Attorney, Agent, or Firm* — McDermott Will & Emery LLP

(57) ABSTRACT

In a method of scanning a charged particle beam which can position the scan position to a proper location inside a deflectable range of the scan position of charged particle beam, the scan position of charged particle beam is deflected to a plurality of target objects inside a scan position deflectable region and on the basis of a shift of a target object at a scan location after deflection, the deflection amount at the scan location is corrected.

7 Claims, 13 Drawing Sheets

CHARGED PARTICLE BEAM SCANNING METHOD AND CHARGED PARTICLE BEAM APPARATUS

RELATED APPLICATIONS

This application is a Continuation of U.S. patent application Ser. No. 11/889,057, filed on Aug. 8, 2007 now U.S. Pat. No. 7,935,925, claiming priority of Japanese Patent Application No. 2006-261651, filed on Sep. 27, 2006, the disclosures of which applications are incorporated by reference herein.

BACKGROUND OF THE INVENTION

The present invention relates to a method of scanning a charged particle beam and to a charged particle beam apparatus and more particularly, to method and apparatus for moving the scan position of a charged particle beam by means of a deflector.

A technique for moving the scan position of an electron beam on a specimen by the deflector (sometimes termed image shift) has been known. As the technique is compared with a technique for moving the scan position of an electron beam on a specimen by means of a specimen stage, the technique using the deflector has features that it can move the electron beam scan position highly precisely and speedily. As regards the image shift as above, US 2006/0219907A1 explains a technique of precisely measuring in advance an amount of movement of an electron beam on a specimen (an image shift amount) in response to a control parameter (control current) of an image shift deflector, that is, measuring a sensitivity to the image shift and registering it.

Nowadays, when there are many measuring points on one chip in a scanning electron microscope for measurement or inspection of, particularly, a semiconductor device, speedup of measurement, for example, is sought by making movement among the many measuring points on the basis of the image shift.

The image shift, however, is a technique of deviating an electron beam from the electron beam optical axis (meaning, in the present specification, an electron beam trajectory through which the electron beam can reach a specimen without being deflected) and therefore, raises a problem that under the influence of, for example, deflective function of lens, the scan position cannot sometimes be moved to a desired location.

In the technique of precisely measuring in advance the sensitivity to image shift and correcting the image shift amount as explained in US2006/0219907AI, there arises a problem that an instance cannot be dealt with in which a plurality of measuring points exist in the deflection region of image shift and the degree of image shift error differs point by point.

SUMMARY OF THE INVENTION

In connection with a charged particle beam scanning method for deflecting the scan position of a charged particle beam and a charged particle beam apparatus, it is an object of the present invention to provide charged particle beam scanning method and charged particle beam apparatus which can settle the scan position at a proper location within a deflectable range of charged particle beam scan position.

Further, the present invention provides method and apparatus which can set a proper optical condition of a charged particle beam within the deflectable range of charged particle beam scan position.

As an example of solving the aforementioned technical problems, a method is proposed which settles, within a deflectable region of charged particle beam scan position, a location of a reference target object at a charged particle beam scan position before deflection of scan position, deflects the scan position of the charged particle beam to a plurality of target objects by making reference to the reference target object and corrects a deflection amount of the scan position on the basis of a shift of each of the target objects at each of the scan positions after deflection, and an apparatus for realizing the correction as well is proposed.

As another example, method and apparatus are proposed in which conditions of adjustment of a charged particle beam are registered in respect of individual plural deflection positions of scan position of the charged particle beam and when the scan position is deflected to each deflection location, the charged particle beam is adjusted on the basis of the individual conditions of adjustment. Still another example of the present invention will become apparent in connection with the best mode for carrying out the invention.

Through the above example of the present invention, accurate deflection of the scan position can be achieved within the deflectable region of the charged particle beam scan position.

Other objects, features and advantages of the invention will become apparent from the following description of the embodiments of the invention taken in conjunction with the accompanying drawings.

DETAILED DESCRIPTION OF THE INVENTION

Embodiments of the present invention will be described hereunder in detail with reference to the drawings.

Figure 1:
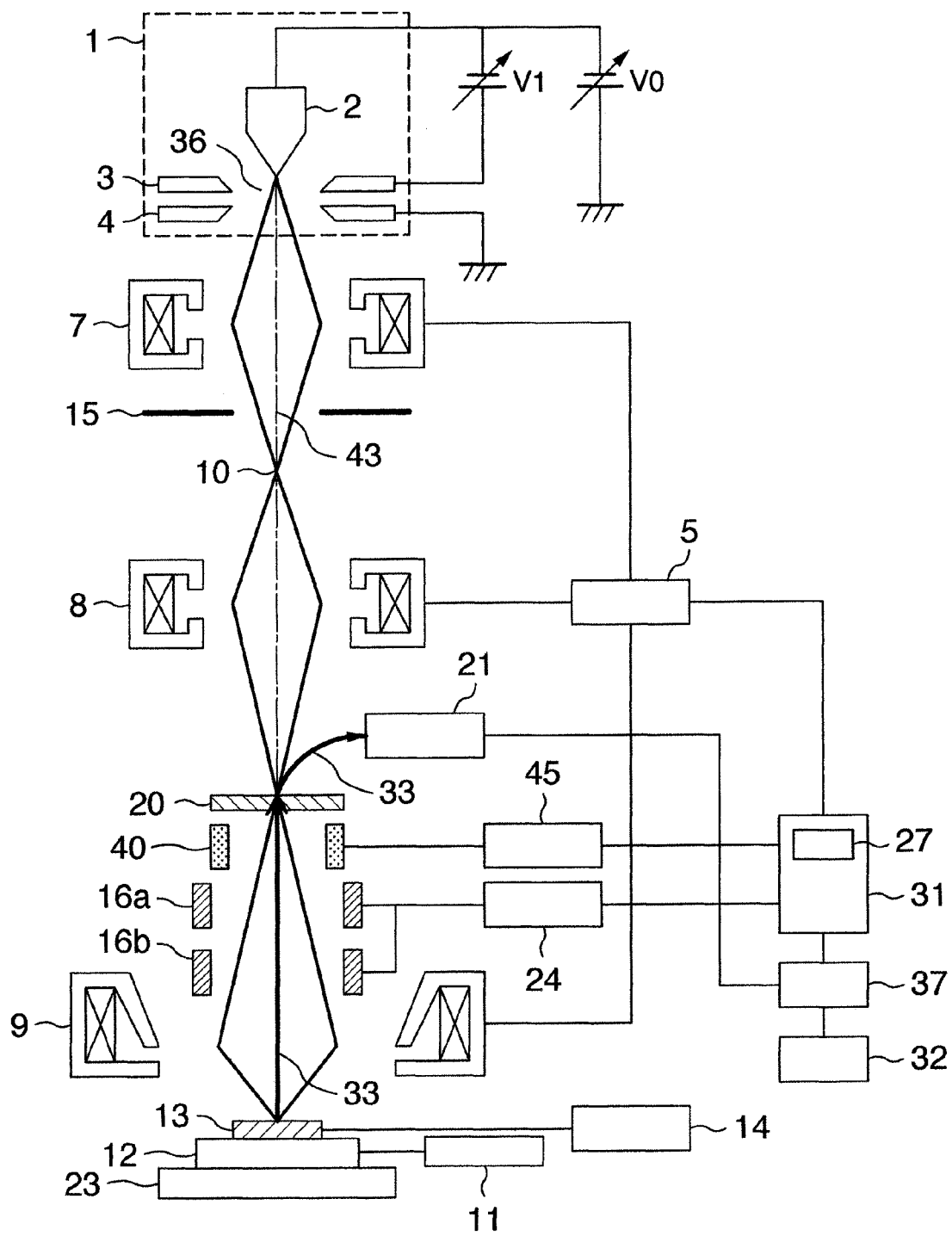
FIG. 1 is a diagram schematically showing a scanning electron microscope.

FIG. 1 is a diagram for explaining a schematic view of a scanning electron microscope (SEM) exemplifying a charged particle beam apparatus. The following description will be given by way of example of the scanning electron microscope but this is not limitative and embodiments to be presented hereinafter can also be applicable to other types of charged particle beam apparatus such as for example a focused ion beam (FIB) apparatus.

An electron gun 1 is comprised of an electron source 2, an extraction electrode 3 and an accelerating electrode 4. Extraction voltage V1 is applied between electron source 2 and the extraction electrode, so that an electron beam 36 can be extracted from the electron source 2.

The accelerating electrode 4 is maintained at earth potential and accelerating voltage V0 is applied between accelerating electrode 4 and electron source 2. Accordingly, the electron beam 36 is accelerated by the accelerating voltage V0. The accelerated electron beam 36 is removed of its unwanted region by means of an aperture 15 and is converged by means of condenser lenses 7 and 8 which are connected to a lens control power supply 5. Further, the thus converged electron beam is focused, by means of an objective lens 9, on a specimen 13 such as a semiconductor wafer mounted on a specimen stage 12.

The specimen stage 12 can be moved at least horizontally by means of a stage drive unit 23. The specimen 13 is irradiated with the focused electron beam 36, which is scanned by means of deflectors 16a and 16b connected to a scanning signal generator 24. At that time, a stigmator 40 is controlled by means of an astigmatism correction controller 45. Electrons 33 given off from the specimen 13 under the irradiation of electron beam 36 (secondary electrons and/or backscattering electrons) are detected by means of a signal detector 21. The detected electrons 33 are converted into a brightness modulation signal for an image display unit 32 such as CRT so that an enlarged image of the specimen 13 may be displayed on the image display unit. The above constituent components are accommodated in a vacuum vessel suitable for irradiation of the electron beam, although not illustrated.

Figure 2:
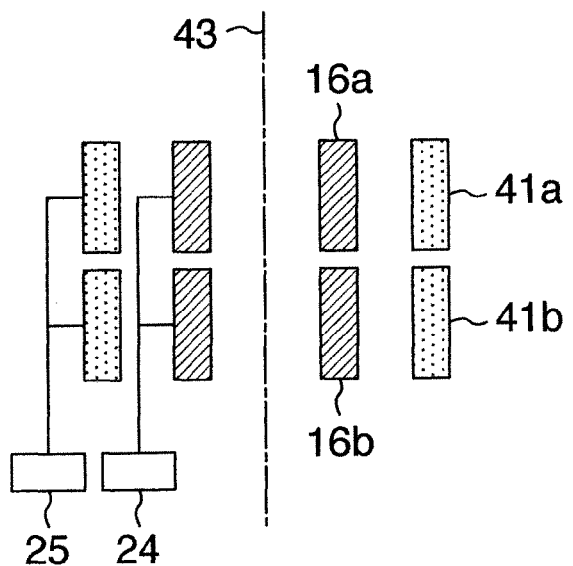
FIG. 2 is a diagram showing an example of construction of a deflector.
Figure 4:
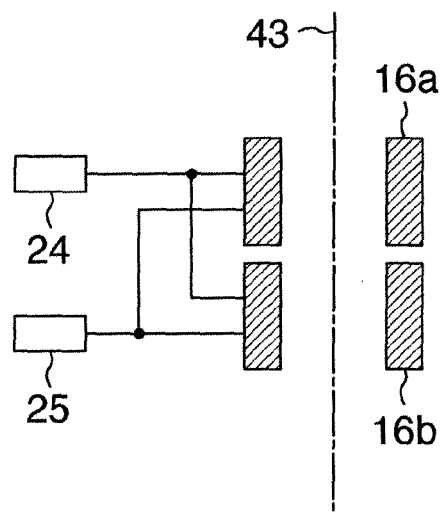
FIG. 4 is a diagram showing an example of construction of the deflector.

When a target object is measured, inspected or observed by moving the scan position of the electron beam 36, a control signal from the scan signal generator 24 and a control signal from a scan position controller 25 may be superimposed on each other and then supplied to the deflectors 16a and 16b as shown in FIG. 4, permitting the same deflectors to be used for scanning the electron beam and for moving the scan range of the electron beam or, as shown in FIG. 2, deflectors 41a and 41b for moving the scan range may be provided separately.

Figure 3:
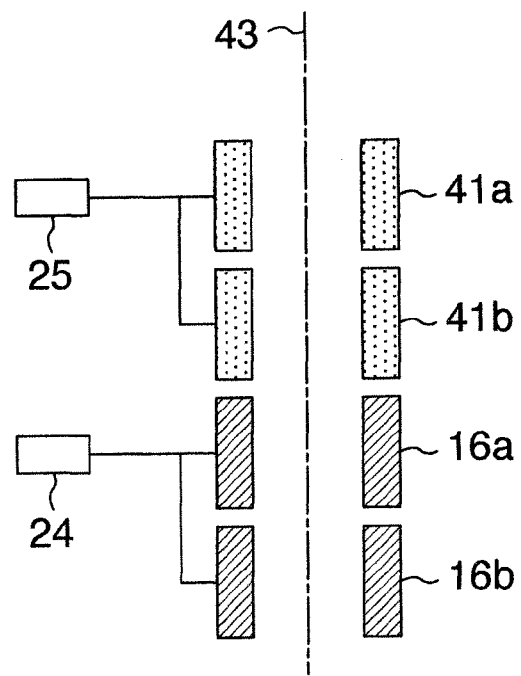
FIG. 3 is a diagram showing an example of construction of the deflector.

The deflector 41 may be arranged concentrically as shown in FIG. 2 or may be arranged along an optical axis 43 of electron beam as shown in FIG. 3. For example, in the case of the deflector 41 being an electromagnetic deflector constructed of a coil, currents induced in the deflector 16 used for ordinary scanning and in the deflector 41 used for position movement of the electron beam have less influence in the construction of FIG. 3 than in the construction of FIG. 2. On the other hand, in case the deflector 16 is an electrostatic deflector constructed of electrodes which are applied with voltage to deflect the electron beam, a scanning signal voltage from the scanning signal generator 24 and a deflection voltage from the scan position controller 25 can be controlled in a superimposed fashion as illustrated in FIG. 4.

The lens control power supply 5, scanning signal generator 24 and scan position controller 25 are connected with a control unit 31 including a storage 27. The storage 27 is stored with a program for automatic execution of a flowchart and the like to be described hereinafter and the control unit 31 controls the aforementioned constituent components in accordance with the stored program. The following embodiments will be described by way of example of the control unit 31 being connected directly to the scanning electron microscope proper but this in not limitative and for example, the control unit 31 may be arranged remotely and may control the scanning electron microscope through the medium of a network. Further, the storage 27 will not necessarily be integral with a portion adapted to generate signals for controlling the individual constituent components of the scanning electron microscope and may be arranged separately via any communication means.

Further, an image processor 37 incorporates a memory medium for storing images formed on the basis of electrons detected in the detector 21 and stores a program for forming a line profile as regards measuring target objects on the specimen and for measuring dimensions of the measuring target objects on the basis of the line profile. Also, the image processor is so constructed as to execute a program for calculating, on the basis of two or more obtained images, a shift between the images.

As an example of the charged particle beam apparatus for measurement and inspection of semiconductor devices, a critical dimension-scanning electron microscope (CD-SEM) or a defect review-scanning electron microscope (DR-SEM) is available. It is necessary for, especially, the CD-SEM of them to highly accurately take critical dimensions of respective portions of semiconductor wafer representing measuring target objects.

In the measurement and inspection apparatus, the scan position of an electron beam (sometimes termed an observing area) needs to be positioned accurately to a measuring target object. For example, if in the case of movement of the scan position of an electron beam from one measuring location to another measuring location, a desired moving distance extremely differs from an actually moved distance, there arises a problem that depending on the measuring magnification, the measuring target object will not be within the observing area or part of the measuring target object will be outside the observing area.

Under the condition as above, accurate measurement is impossible. Accordingly, the measuring magnification needs to be selected in advance by taking the accuracy of movement of the observing area into consideration. Namely, a low magnification needs to be set in anticipation of a movement error.

With the magnification lowered, however, the relative size of the specimen per one pixel of image increases and a shift of one pixel has a large influence upon the accuracy of critical dimension in taking critical dimensions. Accordingly, a trade-off relation exists between improvement in movement accuracy and improvement in critical dimension accuracy.

For controlling the position of an inspection target object, the stage carrying the semiconductor wafer representing a specimen is moved in one method or the scan position of the charged particle beam is moved in another method. Generally speaking, when the movement distance is large, the movement of stage is preferable. When the movement distance is small, the accuracy of stage position control becomes so critical that a desired target object will conceivably get clear of the scan area of an electron beam.

On the other hand, in case the charged particle beam is deflected to move the scan position, the movable range is determined from an optical condition and a physical condition, indicating that this case is unsuitable for a large movement of the field of view for inspection but is suitable for a slight movement.

But, in the case of movement of the scan position of a charge particle beam, it is frequent that for 10 µm movement of the view field in X direction on the wafer, for example, simple movement of the charged particle beam in the X direction is insufficient and in addition thereto, control needs to be executed by taking characteristics of the lens, for example, into consideration. In moving the scan position of charged particle beam, the charged particle beam is urged to pass through the objective lens while being deviated from the optical axis, causing a problem that depending on the deflective function of the lens, the arrival position of charged particle beam on the specimen will be shifted or that when the objective lens is constructed of a magnetic field lens, the arrival position will further be shifted under the influence of a rotational action due to a magnetic field. As far as the shift amount is small, it can be neglected but depending on the construction of the objective lens, the shift amount will develop to a great extent. Besides, as the movement amount of the scan position of charged particle beam increases, the eccentricity from the optical axis becomes large. In other words, the charged particle beam passes through the outer side of the lens, thus being affected by the deflective function of the lens largely so as to be shifted largely.

An embodiment will now be described below in which the shift amount is measured in advance to control the movement amount of the charged particle beam in order to enable the charged particle beam to arrive at a desired location.

Figure 5:
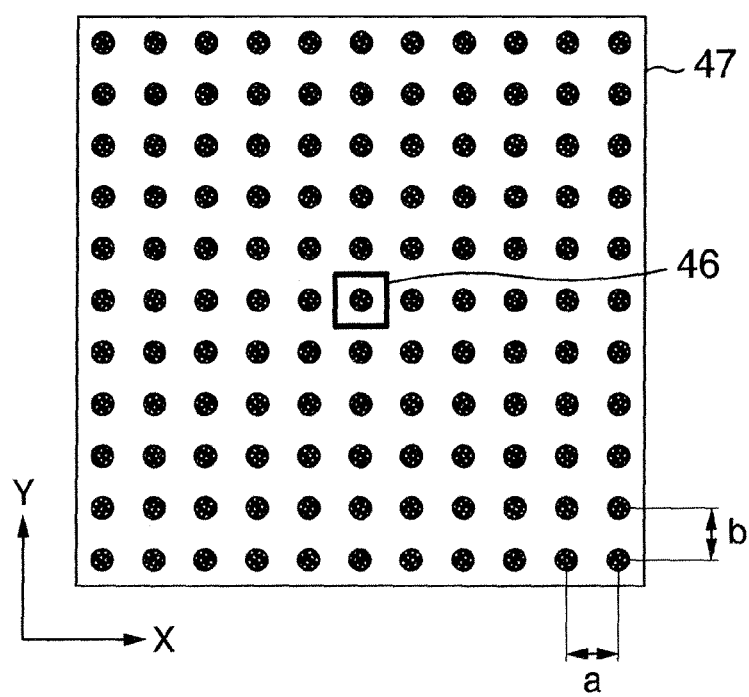
FIG. 5 is a diagram showing an example of a specimen having dot patterns arranged at a predetermined pitch.

Firstly, a wafer is prepared having specified patterns arranged at a pitch of a [µm] in x direction and at a pitch of b [µm] in y direction as shown in FIG. 5. In this example, the target object is a dot pattern and therefore, by determining the center of gravity of a circle and then by measuring a positional shift of the centroid, an amount of error in movement of the charged particle beam can be calculated.

An example of measurement will be described in accordance with a flowchart of FIG. 7. Firstly, a region 47 for which measurement is carried out is determined (step 100). Next, the field of view is moved so that an area 46 in the center of pattern array may be displayed in the center of the screen. This is set as a reference location (step 101). In this phase, with a view to promoting the accuracy of measurement of an error amount relative to an amount of movement of the scan position of the charged particle beam, the amount of movement of the electron beam 36 is preferably "0". Accordingly, the stage drive unit 23 is used preferably for the view field movement.

Next, a magnification for measurement is determined at the reference area 46 in the center (step 102). With the magnification set to be excessively high at that time, there arises a problem that when the positional accuracy of electron beam 36 is poor, the measuring target object cannot enter the view field or partially goes out of the view field, making the measurement impossible and hence selection of a magnification suited to the measurement is necessary.

Subsequently, a pitch (x, y) for measurement is determined and inputted (step 103). Since the example of FIG. 5 is a dot pattern, a set of pitches (a, b) for the patterns, for example, is inputted. Thereafter, an image of the area 46 at the reference location is acquired and is determined as a reference image (step 104). A centroid (X0, Y0) of the reference target object is determined from the acquired reference image (step 105). For example, as shown at the area 46 in FIG. 8, the cross cursor position is brought into coincidence with the center of gravity (X0, Y0). Next, the scan position of electron beam 36 is moved to the first area 51 as shown in FIG. 6 (step 106) and an image is acquired (step 107).

Figure 6:
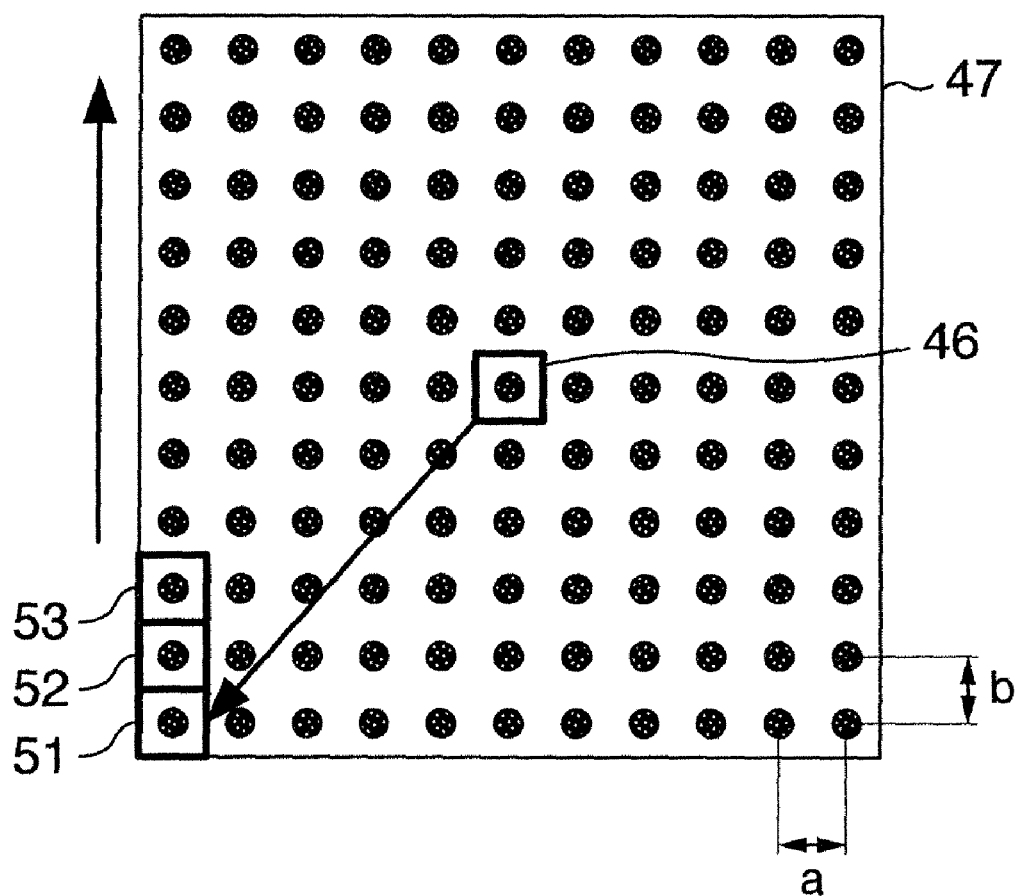
FIG. 6 is a diagram showing an example of the order of movement to measuring locations.
Figure 8:
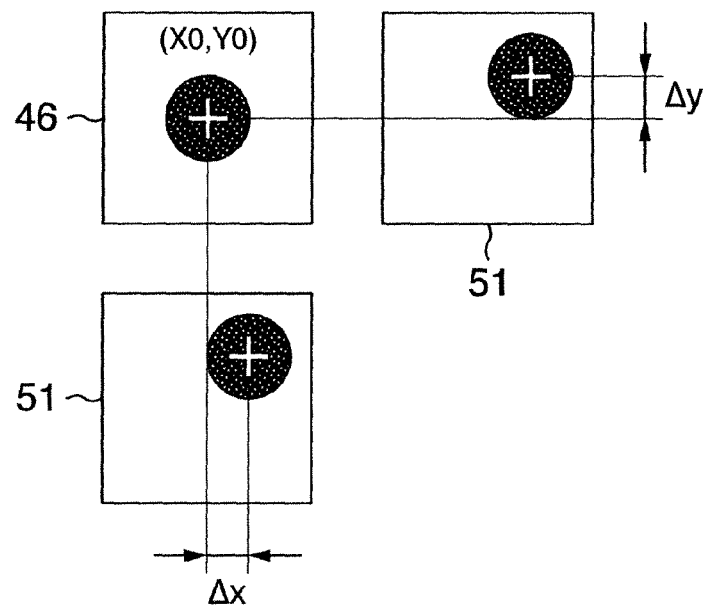
FIG. 8 is a diagram for explaining an example of a method for calculation of positional errors in scan position.

Illustrated in FIG. 6 is a method for acquiring images sequentially from left below but the order of acquisition is arbitrary. Next, a position of centroid (X1, Y1) of the image pattern acquired at the area 51 is determined (step 108). As indicated in FIG. 8, the position of centroid of the area 46 representing the reference image is compared with the position of centroid of the image at the area 51 to measure an error amount (Δx1, Δy1) (step 108). The image processor 37 conducts the measurement of position of centroid and measurement of error amount by, for example, storing the acquired images and calculating positions of centroid of the dot patterns representing the target objects. Detection is made as to whether the position of centroid coincides with the position of pixel position (X, Y) of image and a result of detection is stored. By comparing the position of centroid (X0, Y0) of the reference image at the area 46 in the center with the position of centroid (Xn, Yn) of the n-th acquisition, an error amount (Δxn, Δyn) is calculated in terms of the pixel size. A series of data processes for sequential acquisition of images of areas 52 and 53, measurement of centroids and measurement of an error amount between the centroid and the center of the reference image is carried out in accordance with designated pitches within a designated region. Alternatively, the movement of electron beam 36 may be controlled at a k-multiple of the pitch.

Of the previously-described data procedure, the steps 106 to 109 are executed reiteratively until the image acquisition and measurement in the designated region ends (step 110), followed by derivation of a correction expression complying with an amount of movement of electron beam 36 (step 111). Specifically, a current or voltage (signal) for causing the movement amount to change by (Δxn, Δyn) is added to or subtracted from an original signal. In the storage 27, signals corresponding to predetermined deflection distances are originally stored in respect of electron beam accelerating energy levels, focus conditions of the objective lens and the like and then the signals obtained as above are stored as signals for correction of those signals.

Through the use of the correction expression, the scan position of electron beam 36 can be controlled highly accurately (step 112).

By acquiring error amounts at intervals of known pitches, accurate scan positioning can be achieved irrespective of the deflection position of image shift. If positions for measurement with the CD-SEM, for example, are predetermined, the error amounts are not determined in a matrix fashion as in the present example but error amounts may be determined selectively for target patterns required of measurement by using a test specimen having patterns arranged under the same condition as a measuring target specimen.

The above procedure is a mere example and data may otherwise be processed by acquiring all necessary images in a region and thereafter, calculating error amounts.

Figure 18:
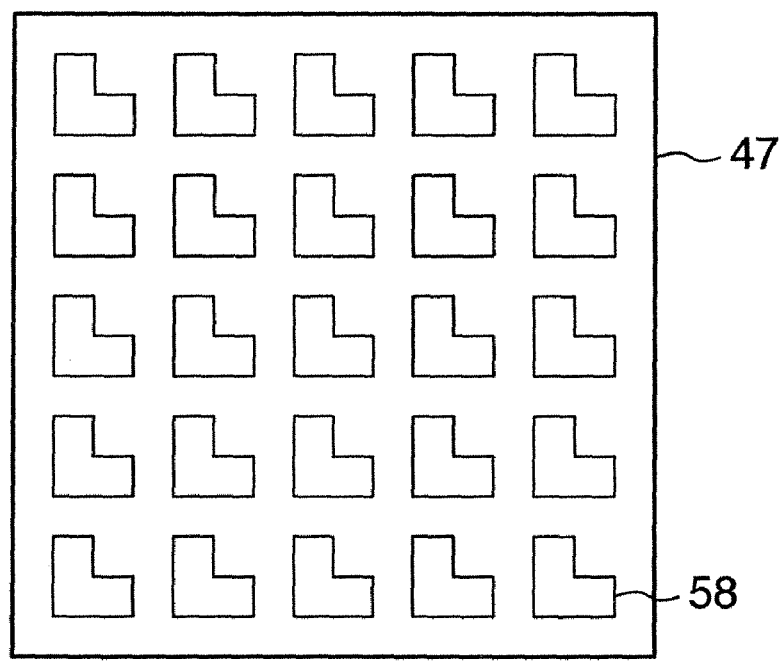
FIG. 18 is a diagram showing an example of a sample having patterns for measurement arranged at a predetermined pitch.
Figure 19:
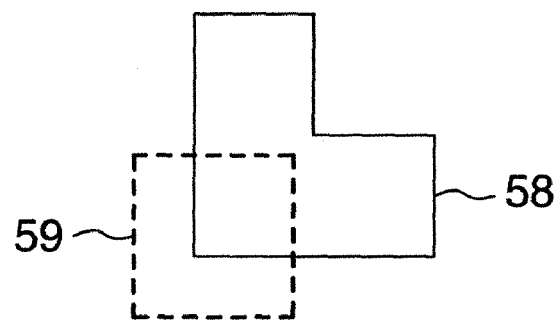
FIG. 19 is a diagram showing an example of a template for pattern matching.

To add, in the case of the pattern for adjustment being a dot pattern as shown in FIG. 5, the method of determining the center of gravity of a circle is suitable but when the pattern is a pattern 58 as illustrated in FIG. 18, for example, not the center of gravity but a partial edge of the pattern 58 may be made to be a reference for pattern matching through which a shift amount may be measured. More specifically, pattern matching is conducted between a template 59 of edge portion and an edge portion displayed on an actual SEM image and movement amounts Δx, Δy of the template and/or SEM image may be treated as shift amounts.

Figure 10:
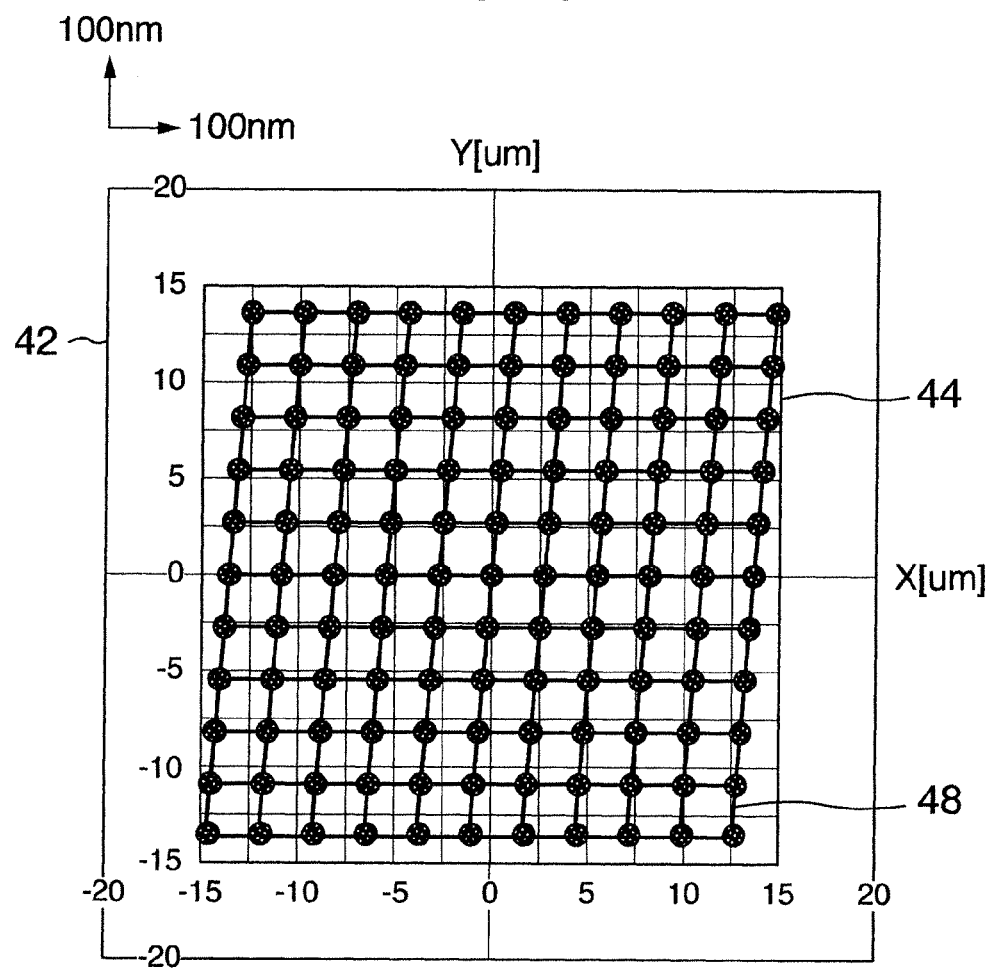
FIG. 10 is a diagram for explaining an example of graphically indicating positional errors in scan position.

FIG. 10 shows an example where a map of movement range of the electron beam 36 in X and Y directions is prepared and an error amount 48 is indicated at a position at which each image is obtained. By designating amounts of movement of the scan position of electron beam 36 on (X, Y) axes and displaying error amounts (Δxn, Δyn) at a coordinate point, confirmation by the user can be facilitated and confirmation of symmetry/asymmetry can also be clarified at a glance.

Also, by displaying graduation scales 26 of the error amount 48 concurrently, the error amount can be confirmed quantitatively. In addition, by displaying an ideal map 44 for the error amount being "0" in the same region, the direction in which an error takes place and its size can also be confirmed visually.

Figure 9:
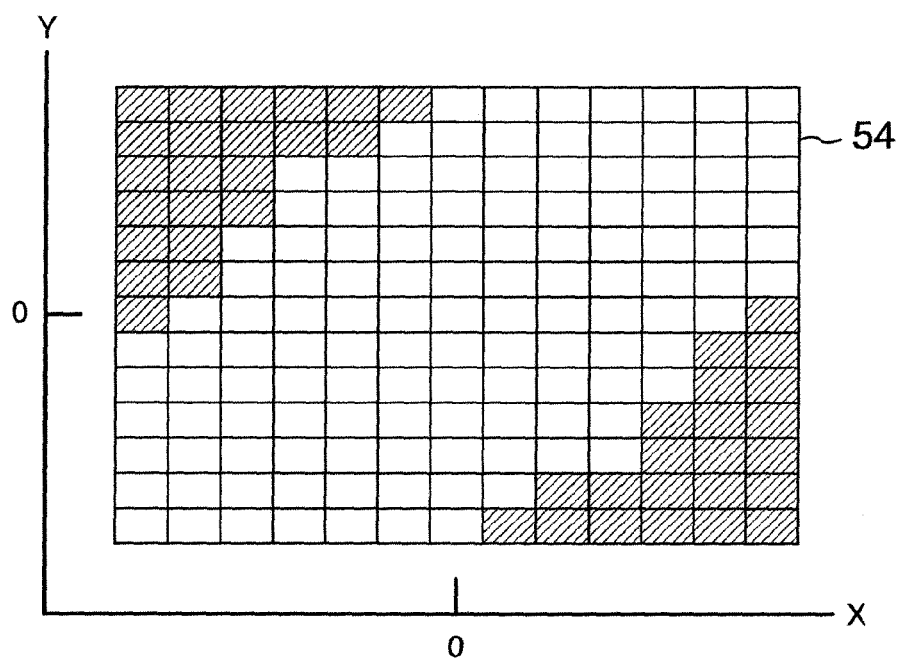
FIG. 9 is a diagram for explaining an example of positional errors in scan position.

Alternatively, the error amount may be indicated in the form of a table 54 shown in FIG. 9. For example, a threshold value is provided for the error amount, so that a location at which the indication value is in excess of the threshold can be changed in color to facilitate recognition of a scan position having a large error amount. Likewise, a threshold value can be provided for the error amount even in the map of FIG. 10, permitting a location in excess of the threshold to be indicated in different color.

In the foregoing embodiment, the area at which the movement amount of charged particle beam is "0" is centered and all areas covering the movement range (±X, ±Y) are measured but if the symmetry is known in advance, the measuring range may be restricted to ½ or ¼ of the entire region.

Embodiment 2

Figure 11:
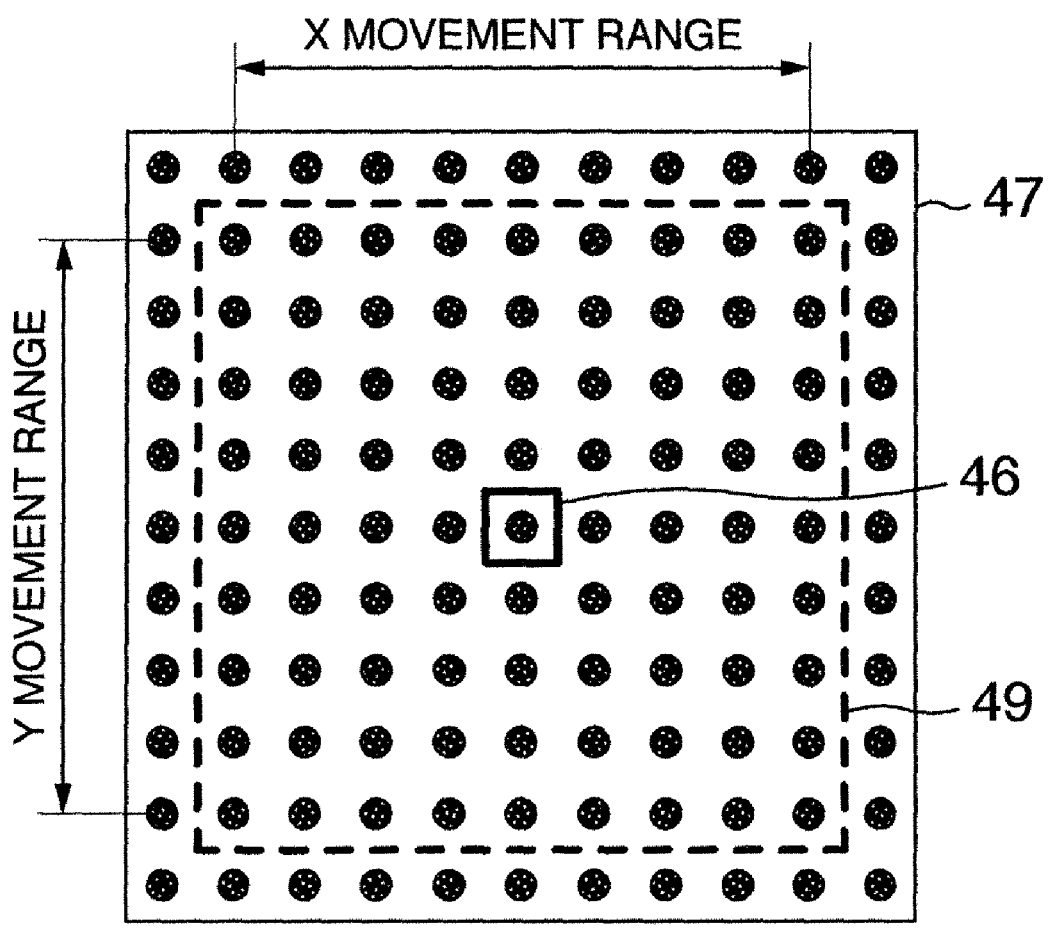
FIG. 11 is a diagram for explaining an example of movement range and measurement region.

By setting the measuring range of error amount to a range wider than that of movement amounts of charged particle beam allowed for the apparatus, correction can be made highly accurately although depending on a correction calculation method. For example, when a range wider than the X movement amount range and Y movement amount range on the apparatus is taken as shown at region 47 in FIG. 11, the accuracy of calculation of correction for error amount can be ameliorated. For example, a method for correction calculation is employed according to which four location points are extracted out of points indicated in FIG. 10 to prepare a quadrilateral and an equation representative of the quadrilateral is used to calculate an error amount at a position inside it. If, in this case, correction is desired to be made at all areas as shown in FIG. 11, information regarding a region outside the movement range is needed. And in this case an error amount is calculated on the basis of address information of a scan position.

To promote the accuracy, better results can be obtained by acquiring images through the previously-described movement of scan position of the charged particle beam at intervals of the pitches rather than k-multiple of the pitch and measuring error amounts.

On the other hand, when the specimen 13 is carried on the specimen stage 12 so as to be moved by means of the stage drive unit 23, because of vulnerability to the influence the accuracy of the stage has, a slight movement or drift of the stage expected to occur during a time period of error amount measurement causes a drift amount of the stage to be included in the measurement of error amount, making a net error amount of electron beam 36 fail to be measured. This is responsible for degradation in the positioning accuracy during control of the scan position of the electron beam 36. To solve this problem, the upgrade of the accuracy of the stage per se is desired at the cost of the fact that the movement amount of the stage is measured periodically and is so controlled as not to affect the position accuracy of the electron beam 36.

For the case of the pattern of error amount measurement being as shown in FIG. 5, a fundamental example of a method for measurement of the drift amount of the stage will be described. Firstly, an image at area 46 where the movement amount of scan position of electron beam 36 is "0" is acquired and a position of centroid of a dot pattern the target object has is determined. After a constant time has elapsed, an image of the area 46 is reacquired and a position of the centroid is determined in a similar way. A shift of the centroid position corresponds to a drift amount of the stage. The drift amount of the stage, however, tends to reflect a state prior to initiation of the measurement and if, for settlement of a measurement field of view, for example, the field of view is determined by moving the stage, direction and distance of movement of the stage immediately before the measurement has an influence upon the drift amount.

Figure 12:
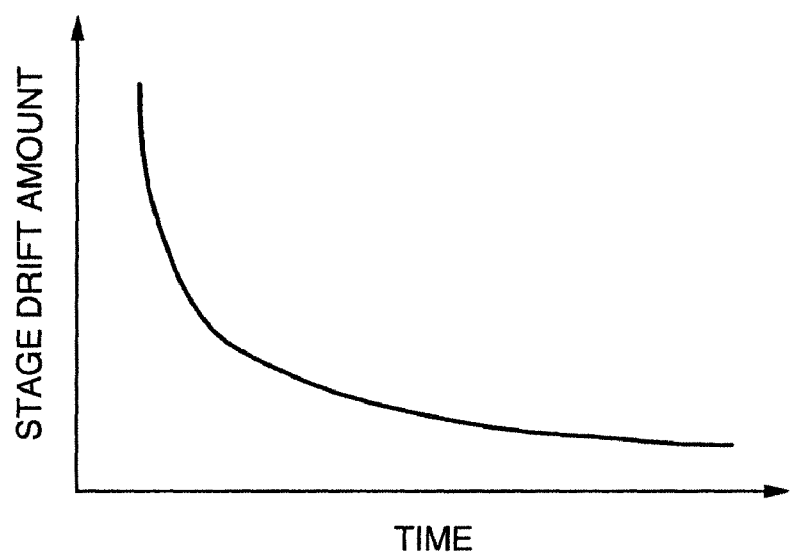
FIG. 12 is a diagram showing the relation between the time and the drift amount of a stage.

For example, with a stage having such characteristics that as shown in FIG. 12, the drift amount tends to increase immediately after stoppage of the stage, that is, immediately after measurement initiation but decrease as the time elapses, the tendency toward the drift shown in FIG. 12 can be measured with high accuracies by performing measurement of the drift amount within a short period of time.

Figure 14:
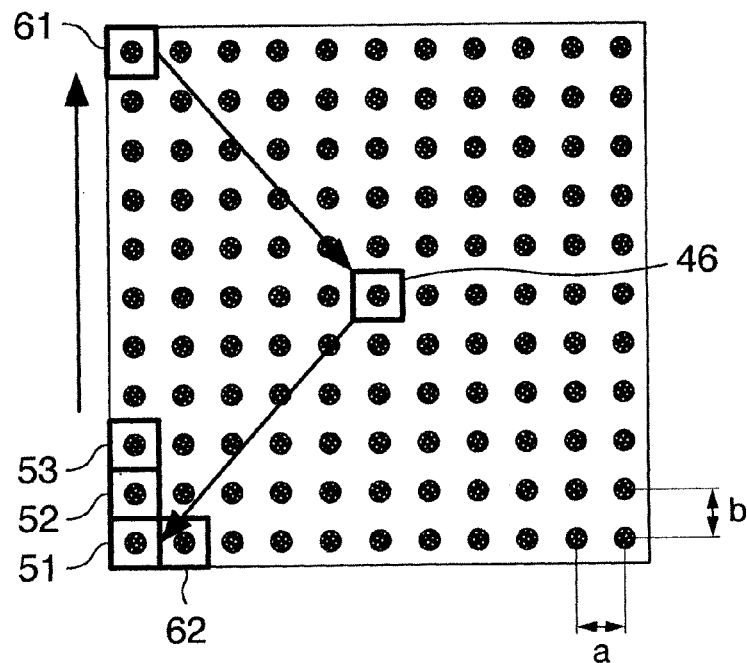
FIG. 14 shows an example of the order of measuring the drift amounts of the stage.

By combining the aforementioned method for control of the scan position of electron beam 36 with the drift amount of stage as above, the accuracy of scan position control can be improved. Accordingly, the stage movement amount must be measured in FIG. 7 during a period of repetition of the step ranging from image acquisition (step 104) to measurement of error amount (step 109) at the area 46. For example, an image is acquired at the area 46 where the movement amount of electron beam 36 is "0" as shown in FIG. 14 and the position of centroid of the dot pattern is measured. The area 46 concerned is set as a first area 46.

Images are acquired sequentially from area 51 to area 61 and the positions of centroid of individual dot patterns are measured. Thereafter, the electron beam 36 is returned to the area 46 where the movement amount is "0" and image acquisition and measurement of the centroid position are again conducted. The area 46 now concerned is set as a second area 46. Since the movement amount of electron beam 36 is "0" for both the images, a shift amount in centroid between the first area 46 and the second area 46 can be measured as a drift amount of the stage. Needless to say, no shift amount means the absence of drift of the stage.

Figure 13:
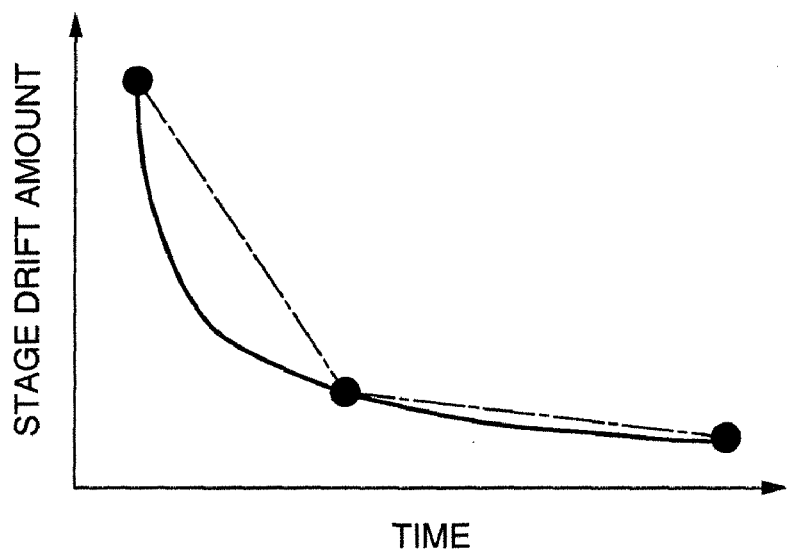
FIG. 13 is a diagram showing the relation between the time and the drift amount of the stage.

Further, the accuracy is affected by the timing of measurement method. For example, in measurement at only three points as shown in FIG. 13 on the characteristic of FIG. 12, the accuracy of drift amount deteriorates. Measurement at a greater number of points can lead to improvements in accuracy.

Figure 7:
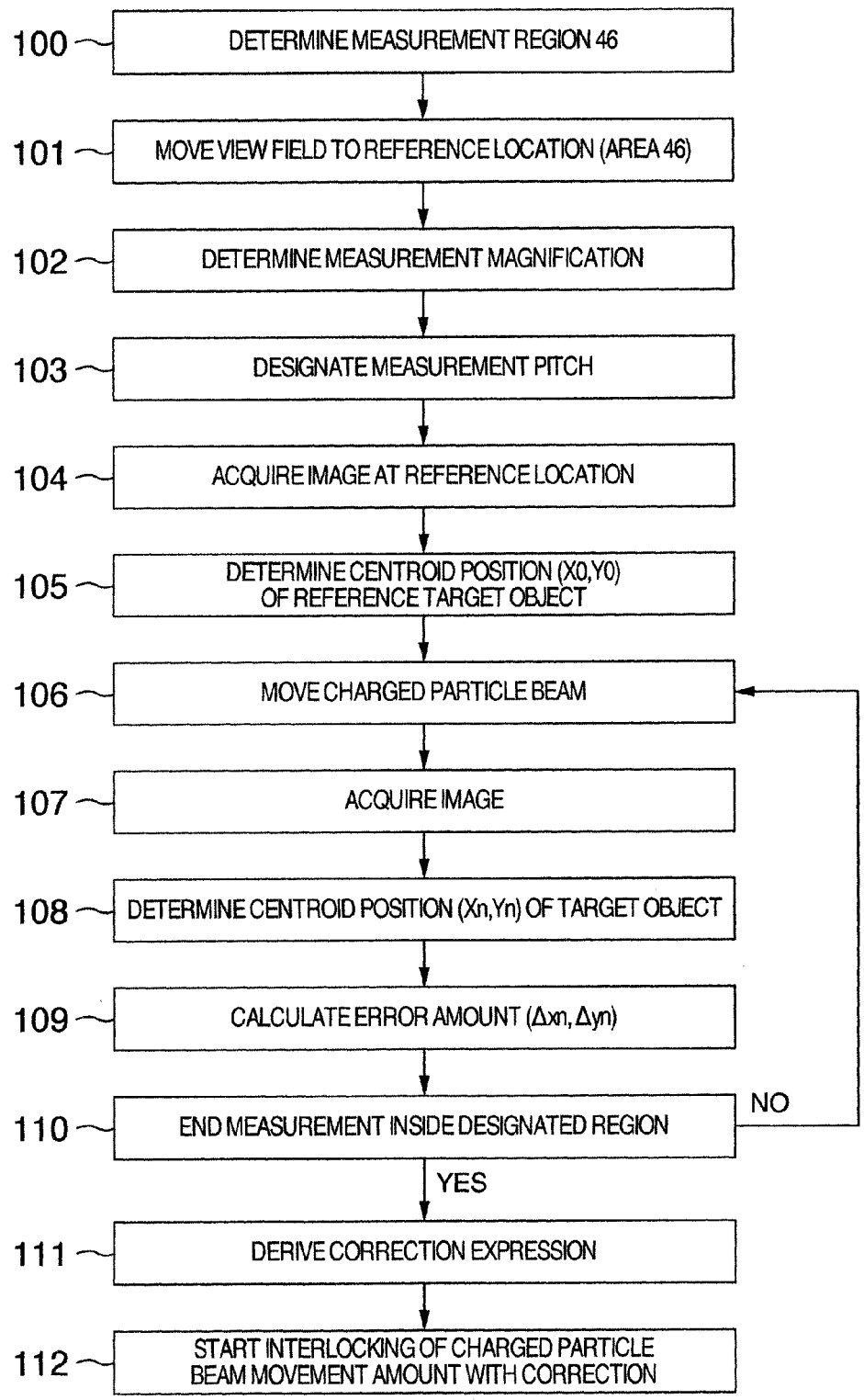
FIG. 7 is a flowchart showing the procedure for measurement of a positional error in scan position.
Figure 16:
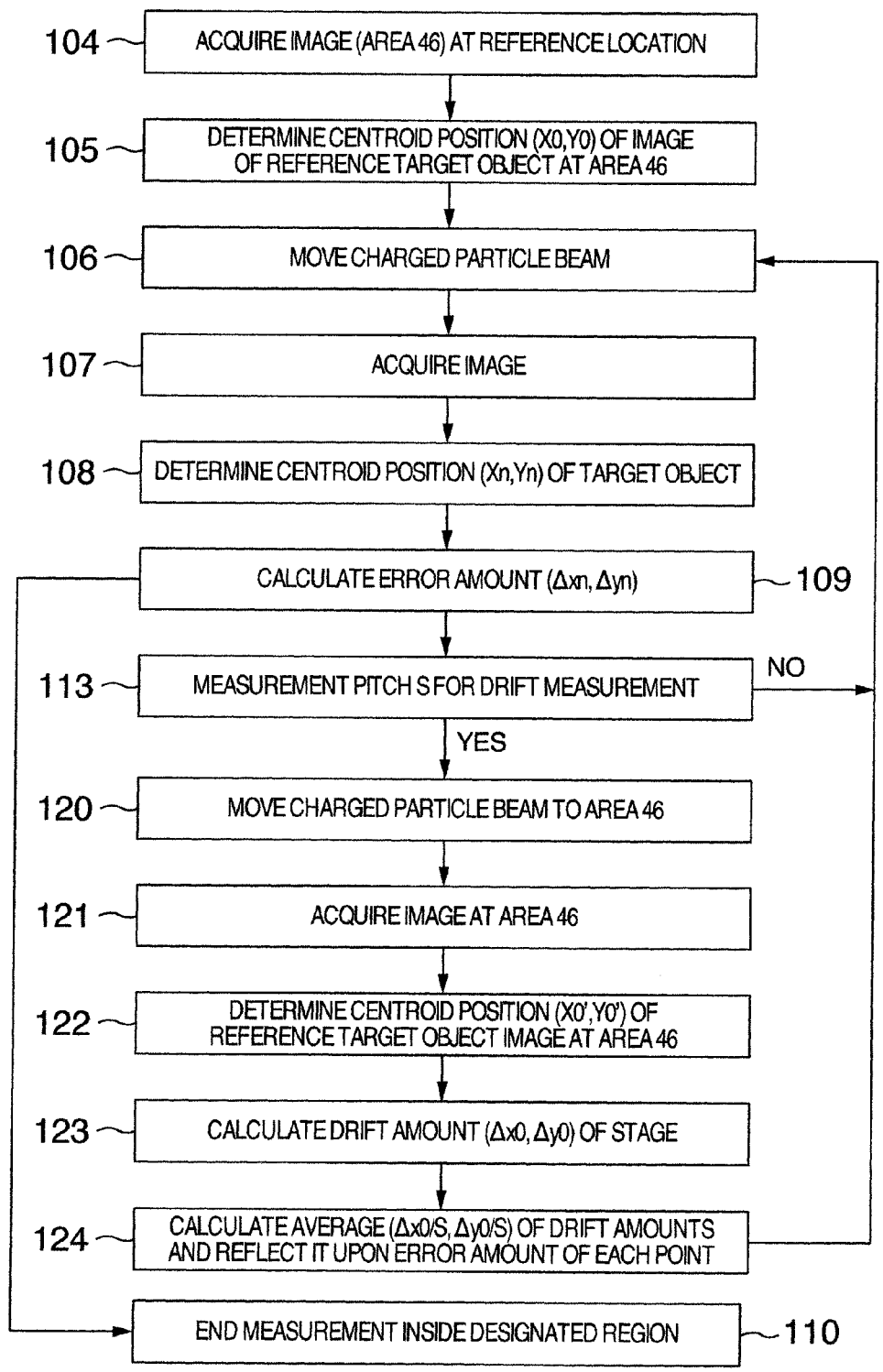
FIG. 16 is a flowchart for explaining the procedure for stage drift amount measurement and measurement of positional errors in scan position.

For example, in a flowchart of FIG. 16, the measurement of a drift amount of the stage is added between the movement of scan position of electron beam 36 (step 106) and the end of measurement within a designated region (step 110) in the flowchart of FIG. 7. A pitch S for drift measurement is set in advance. For example, in case the drift amount is measured at the termination of measurement of one line in Y direction ranging from area 51 to area 61 in FIG. 14, the pitch is set to "11". While moving the scan position of electron beam 36 (step 106), images are acquired from areas 51 to 61 in FIG. 14 to measure positions of centroid, thus determining error amounts (step 107 to step 109).

At acquisition of area 61, the designated pitch for drift measurement reaches 11 and then an image of area 46 where the movement amount of electron beam 36 is "0" is acquired (step 121) and a position of centroid (X0', Y0') of the target object is determined (step 122). A difference (Δx0, Δy0) from the centroid position (X0, Y0) of the target object impersonating the first area 46 is calculated to provide a drift amount of the stage (step 123). A quotient (Δx0/11, Δy0/11) of division of the drift amount by the pitch "11" is added to or subtracted from individual error amounts (Δxn, Δyn) measured at respective points corresponding to the areas 51 to 61. A resulting value indicated by (Δxn', Δyn') is calculated as an error amount of scan position of the electron beam 36. This value is expressed by expression 1.
(Expression)

$$(\Delta xn', \Delta yn') = (\Delta xn + \Delta x0/s, \Delta yn + \Delta y0/s)$$

The drift amount being "0" signifies that the stage is removed of drift and in other cases, correction in consideration of a movement of the stage must be made.

As described previously, the drift sometimes changes with a direction in which the stage moves immediately before measurement. Accordingly, when the critical dimension is taken in a pattern by using the error amount determined according to the present example, a change needs to be made in accordance with a direction in which the stage is moved immediately precedently. For example, if the stage is moved from left to right and then stopped, there is a possibility that a drift from left to right will occur.

For example, when a plurality of points on a semiconductor wafer are measured and inspected, there is a possibility that the direction of generation of a drift will change even at the same measuring location depending on the fact as to where the immediately preceding measurement and inspection is carried out. Accordingly, in setting the measurement procedure for actual measurement, it is preferable that a correction expression be introduced in accordance with the location of a measuring target object subject to immediately preceding measurement.

In addition, since the drift amount changes in accordance with a distance from a measuring position subject to immediately preceding measurement, a correction expression may otherwise be derived on the basis of the relation between the inter-measurement point distance and drift amount.

Furthermore, in positioning observation areas at a plurality of measuring locations inside the image shift deflection region, the influence of drift will conceivably change in accordance with the order of observation (observation time) and therefore a correction expression taking the change factor into account is preferably derived.

Embodiment 3

A semiconductor wafer as representing the specimen 13 is not always flush, having different heights. Therefore, the movement amount of scan position of electron beam 36 needs to be controlled cooperatively with the height. For example, when the deflector 41 is used for control of the scan position, the movement amount will change with different specimen heights even if the same current or voltage is applied to the deflector 41.

Further, if the distance over which movement is made is large in moving the scan position of electron beam 36, an aberration due to curvature of field results in an astigmatism and the like and a change develops. This impairs clarity of image, that is, an image blurs, degrading the accuracy of measurement of the centroid of the target object. Then, depending on the movement distance of electron beam 36, an aberration such as aberration due to curvature of field or astigmatism responsible for image blur needs to be adjusted.

If, in the course of measurement of an error amount from the centroid measurement according to the error amount measurement flowchart of FIG. 7, correction of the aberration due to curvature of field, that is, focus correction or astigmatism correction, for example, is made, the accuracy of control of movement amount of electron beam 36 can be improved.

Further, by storing the correction amount in association with the movement amount of electron beam 36, the aberration correction can be made cooperatively with the movement amount and a clear image can be obtained constantly even when the field of view is moved in accordance with the movement of scan position of the electron beam 36.

Also, the movement of scan position of electron beam 36 signifies that the electron beam 36 deviates from the optical axis 43 of objective lens 9, so that when the objective lens 9 is adjusted for focus, the position of an image moves to make adjustment difficult. Through this, all adjustments will possibly be decreased in accuracy. To avoid this inconvenience, the axial alignment of electron beam 36 needs to be made so that the electron beam 36 may pass through the optical axis 43 of objective lens 9. With the axial alignment amount stored in relation to the movement amount of scan position of the electron beam 36, the focus adjustment to be made at the time of movement of the scan position of electron beam 36 can be achieved highly precisely in the absence of position movement of image.

Like the position error amounts shown in FIG. 10, the individual adjustment amounts can be expressed in the form of a map in relation to the movement amounts, facilitating user's confirmation. Alternatively, it may also be indicated in a table as in the case of FIG. 9.

The adjustments including focus correction, astigmatism adjustment and axial alignment can be conducted by the user when the scan position of electron beam 36 is moved but through automation, the controller 31 can be allowed to perform collective control. For the focus correction, either the exciting current to the objective lens or the negative voltage applied to the specimen may be adjusted. Further, not only the general electromagnetic lens and electrostatic lens but also another type of lens separately provided for focus correction may be used to conduct focus adjustment.

A series of the adjustments as above are stored in the storage 27 in association with the scan positions of electron beam 36 in order that when the inspection apparatus performs inspection by moving the scan position of electron beam 36, an inspection can be carried out with highly accurate position control and clear images.

The operator can apply inputs concerning the measurements as above from the image display unit 32. For example, necessary information such as pitches and the number of points to be measured in X and Y directions is inputted from an input port 55. In an alternative, an area to be measured within the image display region can also be designated by a designation pointer 57.

Figure 15:
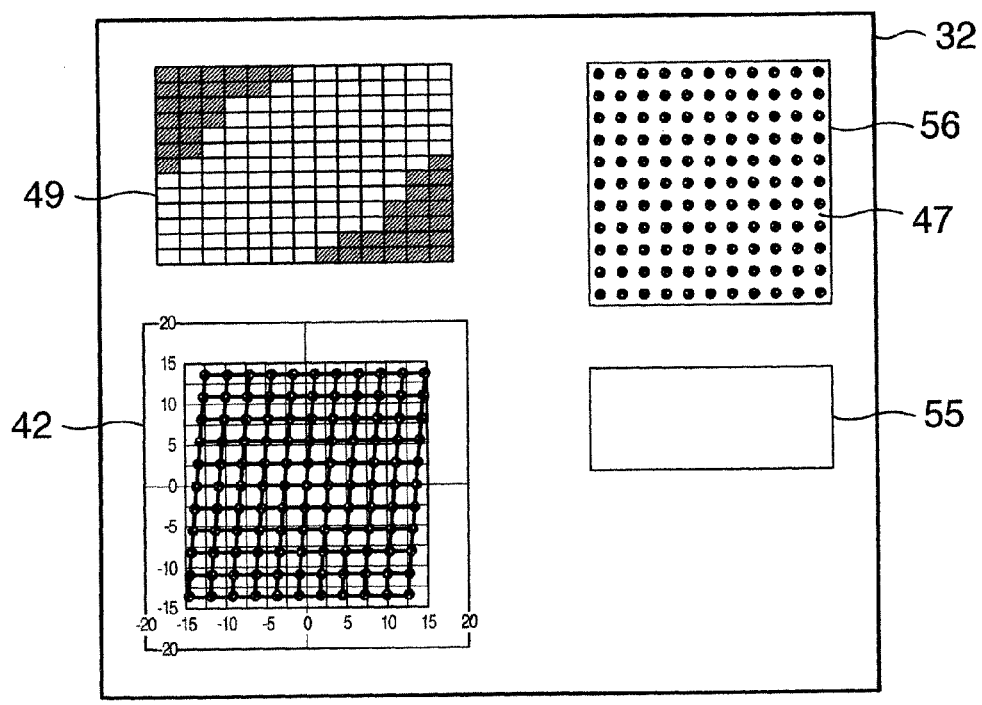
FIG. 15 shows an example displayed on an image display unit.

Further, as shown in FIG. 15, the FIG. 9 table and FIG. 10 graph may be displayed on the image display unit 32 to facilitate user's confirmation.

The scan position of electron beam 36 can be controlled through the data processing method as above but by using only the method for measuring the error amount, the apparatus condition can also be investigated. If, for example, after the measurement of error amount is conducted in accordance with the flowchart of FIG. 7 and the measurement inside a designated region is ended (step 110), a location exists where the error amount exceeds the threshold value, a warning message to the effect that, for example, readjustment is necessary is displayed on the image display unit 32 so as to be given to the user. Alternatively, the error amount may be displayed as shown in FIG. 9 or 10.

Embodiment 4

Recently, of semiconductor wafers, a wafer of the type in which electrification is accumulated in a stationary fashion on the overall wafer surface can be seen here and there. The electrification is known as being difficult to be removed by grounding. Causes of this stationary electrification is accounted for by the fact that, for example, a polar substance inside resist is polarized by friction during resist coating by means of a spin coater and stationary potential results or that the electrification is based on an etching process using plasma.

The electrification accumulated in a stationary fashion over a wide wafer area (sometimes termed global electrification hereinafter) tends to exhibit potential which is the highest in the center of the wafer and decreases toward the edge of the wafer. Potential remaining on the specimen surface forms a lens based on the principle of formation of electrostatic lens. Since the potential of the global electrification differs for the wafer center and wafer edge, the lens function is different at the wafer center and the wafer edge.

In applying the technique explained in connection with embodiment 1 to the wafer, the lens deflection function differs at different positions on the wafer and it is conceivable that a correction expression based on error amounts complying with changes in deflection function is prepared. Conceivably, as an example, in respect of individual electrification voltages at scan positions of electron beam 36, correction expressions in respect of the individual scan positions may be determined.

Figure 17:
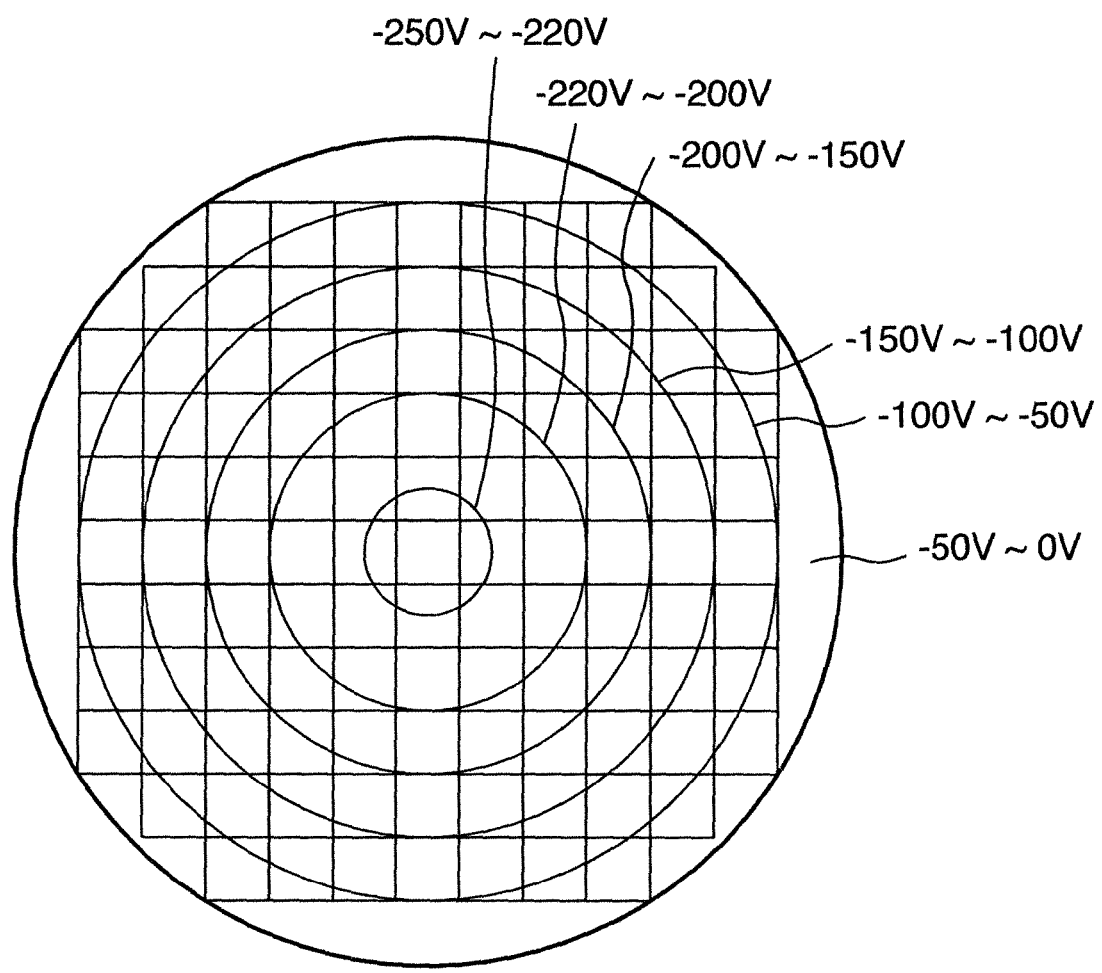
FIG. 17 is a schematic diagram of a wafer accumulated with global electrification.

FIG. 17 diagrammatically shows conditions of global electrification on a semiconductor wafer. As illustrated, the global electrification tends to be intensified toward the center. In other words, since the lens function is greater in the center of wafer, the correction amount tends to be greater at the edge of the image shift deflection region than at the wafer edge. On the other hand, the image shift region is less affected by the lens function in the center than at the edge and therefore, the correction amount slightly changes at the edge of wafer and in the center thereof.

In view of the above, error amounts ($\Delta xn$, $\Delta yn$) at the individual positions inside the deflection region of image shift are preferably calculated in respect of individual electrification voltages to derive correction expressions. With this construction, even in the presence of global electrification, accurate positioning of the scan position can be achieved.

In case the distribution of global electrification is known, an electrification map on a wafer is prepared and collation of measuring positions to the electrification map is made, making it possible to read and apply a correction expression meeting an electrification condition at a particular measuring position. If the global electrification is unknown, a surface potential measurement (SPM) may be used to measure distribution of electrification inside the vacuum vessel or nearby a trajectory where the wafer passes in order that the image shift can be carried out by using, on the basis of electrification conditions at the individual measuring target locations, correction expressions registered precedently in accordance with the electrification conditions. The electrification measuring technique based on the SPM is explained in WO03/007330.

Alternatively, transition of change in global electrification in the wafer surface direction may be approximated by a function and on the basis of the function, a correction expression of electron beam scan position can be derived.

It will be appreciated that the foregoing example of the present invention may be applied to a so-called image shift of moving the scan position at the time that a beam is scanned two-dimensionally or to the case of moving the scan position at the time that a beam is scanned linearly (line scan).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus comprising a deflector for deflecting the scan position of a charged particle beam emitted from a charged particle beam source and a controller for supplying a deflection signal to the deflector, wherein:
said controller controls the deflector so that the scan position of said charged particle beam is positioned to a reference target object on a specimen on which the reference target object and a plurality of target objects having known dimensions relative to said reference target object are formed, the scan position of said charged particle beam is so deflected as to scan said plurality of target objects, a position error between the deflected scan position and each of said target objects is detected in respect of each of said plurality of target objects, and
after that, said controller controls the deflector so that the scan position of said charged particle beam is positioned to the reference target object again, a second position error between the scan position positioned again and the reference target object is detected, a third position error by dividing said second position error by the number of the scanned target objects is obtained, the obtained third position error is added or subtracted to or from the first position error detected in respect of each of said plurality of target objects, and the deflection signal of said deflector in a deflection area of the scan position of said charged particle beam is extracted.

2. A charged particle beam apparatus according to claim 1, wherein said controller acquires images of said reference target object and said plurality of target objects by scanning said charged particle beam, and detects a position error on the basis of a distance between a centroid of said reference target object and that of each of said target objects.

3. A charged particle beam apparatus according to claim 1, wherein said controller acquires images of said reference target object and said plurality of target objects by scanning said charged particle beam, and detects a position error on the basis of a distance between said reference target object and each of said plural target objects obtained by performing pattern matching between them.

4. A charged particle beam apparatus according to claim 1, wherein said position error is determined by adding or subtracting movement components of a movement stage for moving said specimen.

5. A charged particle beam apparatus according to claim 4, wherein said controller deflects the scan position of the charged particle beam to scan said reference target object, and determines the movement components of said movement stage on the basis of the position error between the deflected scan position and said reference target objects.

6. A charged particle beam apparatus comprising a deflector for deflecting the scan position of a charged particle beam emitted from a charged particle beam source and a controller for supplying a deflection signal to the deflector, wherein said controller controls said deflector so that the scan position of the charged particle beam is positioned to a plurality of positions on a specimen, determines a position error in respect of each of the plurality of positions on the specimen, when said deflector deflects the scan position, and derives correction signal of said deflector in the deflection range of the scan position of said charged particle beam on the basis of the position error determined and an electrification voltage of each of the plurality of positions on the specimen deflected.

7. A charged particle beam apparatus comprising a deflector for deflecting the scan position of a charged particle beam emitted from a charged particle beam source and a controller for supplying a deflection signal to the deflector, wherein said controller includes a storage for individually storing deflection signals for deflecting the scan position to a plurality of positions on a specimen, signals for correcting position errors to each of the plurality of positions taking place when the scan position is deflected by using said deflection signals, a correction signal for correcting astigmatism, and a correction signal for correcting focus.

* * * * *